United States Patent
Verdeyen et al.

(10) Patent No.: US 6,573,731 B1
(45) Date of Patent: Jun. 3, 2003

(54) ELECTRON DENSITY MEASUREMENT AND CONTROL SYSTEM USING PLASMA-INDUCED CHANGES IN THE FREQUENCY OF A MICROWAVE OSCILLATOR

(75) Inventors: Joseph T. Verdeyen, Savoy, IL (US); Wayne L. Johnson, Phoenix, AZ (US); Murray D. Sirkis, Tempe, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/030,947

(22) PCT Filed: Jul. 20, 2000

(86) PCT No.: PCT/US00/19535
§ 371 (c)(1),
(2), (4) Date: Apr. 9, 2002

(87) PCT Pub. No.: WO01/06268
PCT Pub. Date: Jan. 25, 2001

Related U.S. Application Data

(60) Provisional application No. 60/144,880, filed on Jul. 20, 1999.

(51) Int. Cl.[7] .......................... G01R 27/32; H01L 21/66; H01L 31/302; H01L 21/306; G01L 21/30; H05B 31/26

(52) U.S. Cl. ....................... 324/639; 324/629; 324/647; 438/714; 438/17; 216/59; 156/345.28; 315/111.21; 315/111.81

(58) Field of Search ........................ 324/629, 633, 324/636, 647, 639, 71.1; 438/17, 714, 10, 14; 376/107; 216/59, 67; 156/345.28; 315/111.21, 111.81

(56) References Cited

U.S. PATENT DOCUMENTS

| | | | |
|---|---|---|---|
| 2,405,229 A | 8/1946 | Mueller et al. | |
| 2,483,189 A | 9/1949 | Eaglesfield | |
| 2,735,941 A | 2/1956 | Peck | |
| 2,971,153 A | 2/1961 | Wharton et al. | |
| 3,265,967 A | * 8/1966 | Heald | 324/307 |
| 3,290,614 A | 12/1966 | Racy | |
| 3,383,509 A | 5/1968 | Goldstein et al. | |
| 3,388,327 A | 6/1968 | Sutton et al. | |

(List continued on next page.)

OTHER PUBLICATIONS

P. K. Atrey et al., "Measurement of chord averaged electron density in ADITYA using 100 GHz and 136 GHz interferometers", Indian J. Physics 66B (5 & 6), 1992, pp. 498–497.
D. Bora et al., "Plasma density measurement using a simple microwave technique", Rev. Sci. Instrum. 59 (10), Oct. 1988, pp. 2149–2151.
D. Bora et al., "A simple microwave technique for plasma density measurement using frequency modulation", Plasma Physics and Controlled Fusion 26 (7), 1984, pp. 853–857.
Nils Brenning, "An improved microwave interferometer technique for plasma density measurements: II", J. Phys. E: Sci. Instrum. 21, 1988, pp. 578–582.

(List continued on next page.)

*Primary Examiner*—N. Le
*Assistant Examiner*—Anjan K. Deb
(74) *Attorney, Agent, or Firm*—Oblon, Spivak, McClelland, Maier & Neustadt, P.C.

(57) ABSTRACT

A method and system for measuring at least one of a plasma density and an electron density (e.g., in a range of $10^{10}$ to $10^{12}$ electrons/$cm^{-3}$) using plasma induced changes in the frequency of a microwave oscillator. Measurement of at least one of the plasma density and the electron density enables plasma-assisted processes, such as depositions or etches, to be controlled using a feedback control. Both the measurement method and system generate a control voltage that in turn controls a plasma generator to maintain at least one of the plasma density and the electron density at a pre-selected value.

34 Claims, 4 Drawing Sheets

U.S. PATENT DOCUMENTS

| | | | |
|---|---|---|---|
| 3,416,077 A | 12/1968 | Lacy | |
| 3,439,266 A | 4/1969 | Rogers | |
| 3,474,336 A | 10/1969 | Alford | |
| 3,490,037 A | 1/1970 | Williams | |
| 3,509,452 A | 4/1970 | Walker | |
| 3,599,089 A | 8/1971 | Bugnolo | |
| 3,699,475 A | 10/1972 | Rogers | |
| 3,899,752 A | 8/1975 | Engelmann | |
| 3,952,246 A | * 4/1976 | Sprott et al. | 324/636 |
| 3,956,695 A | 5/1976 | Stamm | |
| 4,034,312 A | 7/1977 | Armand | |
| 4,096,453 A | 6/1978 | Rogers | |
| 4,540,955 A | 9/1985 | Fiedziuszko | |
| 4,775,845 A | 10/1988 | McCoy | |
| 4,899,100 A | * 2/1990 | Talanker et al. | 324/633 |
| 4,944,211 A | * 7/1990 | Rowan et al. | 376/107 |
| 4,949,053 A | 8/1990 | Havens | |
| 5,621,331 A | * 4/1997 | Smith et al. | 324/637 |
| 5,691,642 A | 11/1997 | Dobkin | |
| 6,074,568 A | 6/2000 | Adachi et al. | |

OTHER PUBLICATIONS

N. Brenning, "An improved microwave interferometer technique for plasma density measurements", J. Phys. E: Sci. Instrum. 17, 1984, pp. 1018–1023.

M. A. G. Calderon et al., "Experimental study of a swept reflectometer with a single antenna for plasma density profile measurement", International Journal of Infrared and Millimeter Waves 6 (7), 1985, pp. 605–628.

G. D. Conway et al., "Plasma density fluctuation measurements from coherent and incoherent microwave reflection", Plasma Phys. Control. Fusion 38, 1996, pp. 451–466.

P. C. Efthimion et al., "1–millimeter wave interferometer for the measurement of line integral electron density on TFTR", Rev. Sci. Instrum. 56 (5), May 1985, pp. 908–910.

J. A. Fessey et al., "Plasma electron density measurements from the JET 2mm wave interferometer", J. Phys. E: Sci. Instrum. 20, 1987, pp. 169–174.

H. Kumar et al., "Measurements of plasma density in argon discharge by Langmuir probe & microwave interferometer", Indian Journal of Pure & Applied Physics 17, May 1979, pp. 316–318.

G. Neumann et al., "Plasma–density measurements by microwave interferometry and Langmuir probes in an rf discharge", Rev. Sci. Instrum. 64 (1), Jan. 1993, pp. 19–25.

Lawrence J. Overzet et al., "Comparison of electron–density measurements made using a Langmuir probe and microwave interferometer in the Gaseous Electronics Conference reference reactor", J. Appl. Phys. 74 (7), Oct. 1, 1993, pp. 4323–4330.

John A. Thornton, "Diagnostic methods for sputtering plasmas", J. Vac. Sci. Technol. 15 (2), Mar./Apr. 1978, pp. 188–192.

J. R. Wallington et al., "A sensitive microwave interferometer for plasma diagnostics", J. Plasma Physics 3 (part 3), 1969, pp. 371–375.

M. Haverlag et al., "Measurements of negative ion densities in 13.56–MHz rf plasmas of $CF_4$, $C_2F_6$, $CHF_3$ and $C_3F_8$ using microwave resonance and the photodetachment effect", J. Appl. Phys. 70 (7), Oct. 1, 1991, pp. 3472–3480.

M. Haverlag et al., "Negatively charged particles in fluorocarbon rf etch plasmas: Density measurements using microwave resonance and the photodetachment effect", Materials Science Forum, vol. 140–142, 1993, pp. 235–254.

G. R. Hanson et al., "Density fluctuation measurements in ATF using correlation reflectometry", Nuclear Fusion 32 (9), 1992, pp. 1593–1608.

G. R. Hanson et al., "A swept two–frequency microwave reflectometer for edge density profile measurements on TFTR", Rev. Sci. Instrum. 63 (10), Oct. 1992, pp. 4658–4660.

K. W. Kim et al., "Development of a fast solid–state high –resolution density profile reflectometer system on the DIII–D tokamak", Rev. Sci. Instrum. 68 (1), Jan. 1997, pp. 466–469.

P. Millot et al., "An advanced radar technique for electron density measurements on large tokamaks", Eighteenth International Conference on Infrared and Millimeter Waves, James R. Birch, Terence J. Parker, Editors, Proc. SPIE 2104, 1993, pp. 240–241.

Masaaki Nagatsu et al., "Application of maximum entropy method to density profile measurement via microwave reflectometry on GAMMA 10", Plasma Phys. Control. Fusion 38, 1996, pp. 1033–1042.

R. Nazikian et al., "Reflectometer measurements of density fluctuations in tokamak plasmas (invited)", Rev. Sci. Instrum. 66 (1), Jan. 1995, pp. 392–398.

L. J. Overzet et al., "Enhancement of the plasma density and deposition rate in rf discharges", Appl. Phys. Lett. 48 (11), Mar. 17, 1986, pp. 695–697.

R. Schubert, "Sensor for plasma density profile measurement in magnetic fusion machine", Sensors and Actuators A 41–42, 1994, pp. 53–57.

S. Shammas et al., "Simplified microwave measurement of uv photoplasmas", J. Appl. Phys. 51 (4), Apr. 1980, pp. 1970–1974.

A. C. C. Sips et al., "Analysis of reflectometry density profile measurements in JET", Plasma Phys. Control. Fusion 35, 1993, pp. 743–755.

W. Hess et al., "A new 17 . . . 23 GHz cavity stabilized, hermetically sealed module VCO in chip technique", Conference proceedings of the $22^{nd}$ European Microwave Conference, vol. 1, Aug. 24–27, 1992, pp. 143–148. INSPEC abstract No. B9211–1350H–047.

H. Flugel et al., "Cavity stabilisation techniques for harmonic–mode oscillators", Proceedings of the eighth colloquium on microwave communication, Aug. 25–29, 1986, pp. 393–394. INSPEC abstract No. B88050407.

Helmut Barth, "A high Q cavity stabilized Gunn oscillator at 94 GHz", 1986 IEEE MTT–S International Microwave Symposium Digest, Jun. 2–4, 1986, pp. 179–182. INSPEC abstract No. B87006105.

P. M. Marshall et al., "Simple technique cavity–stabilizes VCO", Microwaves & RF 24 (7), Jul. 1985, pp. 89–92. INSPEC abstract No. B86014481.

M. E. Znojkiewicz, "8 GHz low noise bias tuned VCO", 1984 IEEE MTT–S International Microwave Symposium Digest, May 29–Jun. 1, 1984, pp. 489–491. INSPEC abstract No. B85017875.

A. Jacob et al., "Optimum design of cavity stabilized FET oscillators", Conference Proceedings of the $13^{th}$ European Microwave Conference, Sep. 5–8, 1983, pp. 509–514. INSPEC abstract No. B84009181.

Brian E. Rose, "10 GHz cavity stabilized FET oscillator", Proceedings of the $32^{nd}$ Annual Frequency Control Symposium, May 31–Jun. 2, 1978, pp. 385–388. INSPEC abstract No. B79030122.

Klaus Schunemann et al., "On the matching of transmission cavity stabilized microwave oscillators", IEEE transactions on microwave theory and techniques MTT–26 (3), Mar. 1978, pp. 147–155. INSPEC abstract No. B78028026.

Brian Owen, "Mechanically tuneable, cavity–stabilized millimeter–wave IMPATT oscillators", 1977 IEEE MTT–S International Microwave Symposium Digest, 1977, pp. 22–25. INSPEC abstract No. B78005511.

Walter R. Day, "Frequency modulation of cavity stabilized solid state diode oscillators", 1973 IEEE–G MTT International Microwave Symposium Digest of Technical Papers, Jun. 4–6, 1973, pp. 247–249. INSPEC abstract No. B74005473.

J. Clarke, "A simple stabilized microwave source", IEEE Transactions on Instrument and Measurement, vol. IM–21 (1), Feb. 1972, pp. 83–84. INSPEC abstract No. B72013995.

David I. C. Pearson et al., "A microwave interferometer for density measurement and stabilization in process plasmas", Materials Research Society Symposium Proceedings 117, Apr. 5–7, 1988, pp. 311–317.

M. Manso et al., "Localized density measurements on ASDEX using microwave reflectometry", Max–Planck–Institut Plasmaphysik Technical Report IPP III/164, Paper No. R1, Sep. 1990, 4 pages.

A. Silva et al., "First density measurements with microwave reflectometry on ASDEX upgrade", Max–Planck–Institut Plasmaphysik Technical Report IPP 1/277, Oct. 1993, pp. 154–157.

Kai Chang, "Millimeter–wave spatial and quasi–optical power combining techniques", International conference on millimeter waves and far–infrared technology conference digest (Cat. No. 89TH0257–6), 1989, pp. 431–434.

Jin–Bang Tang et al., "Finite element analysis of the dielectric resonator", International conference on millimeter waves and far–infrared technology conference digest (Cat. No. 89TH0257–6), 1989, pp. 435–438.

I. V. Altukhov et al., "Far infared radiation from uniaxially compressed p–type GE", International conference on millimeter waves and far–infrared technology conference digest (Cat. No. 89TH0257–6), 1989, pp. 439–442.

Fu–Jiang Liao et al., "Developing status of millimeter wave tubes in China", International conference on millimeter waves and far–infrared technology conference digest (Cat. No. 89TH0257–6), 1989, pp. 443–446.

Li–Rong Jin et al., "D–band silicon IMPATT diode", International conference on millimeter waves and far–infrared technology conference digest (Cat. No. 89TH0257–6), 1989, pp. 447–449.

Sheng–Min Liu et al., "The millimeter wave Gunn oscillator and self–oscillating mixer using the nonradiative dielectric waveguide", International conference on millimeter waves and far–infrared technology conference digest (Cat. No. 89TH0257–6), 1989, pp. 450–452.

Wei Hong et al., "Study on broadband millimeter wave oscillators", International conference on millimeter waves and far–infrared technology conference digest (Cat. No. 89TH0257–6), 1989, pp. 453–456.

Dunfu Li et al, "Influence of moisture on cavity–stabilized oscillators", International conference on millimeter waves and far–infrared technology conference digest (Cat. No. 89TH0257–6), 1989, pp. 457–460.

D. Ni et al., "Millimeter–wave generation and characterization of a GaAs FET by optical mixing", International conference on millimeter waves and far–infrared technology conference digest (Cat. No. 89TH0257–6), 1989, p. 493.

Jing–Feng Miao et al., "New NRD guide oscillator", International conference on millimeter waves and far–infrared technology conference digest (Cat. No. 89TH0257–6), 1989, pp. 494–496.

Yu–Fen Yang et al., "8mm pulse IMPATT oscillators", International conference on millimeter waves and far–infrared technology conference digest (Cat. No. 89TH0257–6), 1989, pp. 497–499.

Ning Chen et al., "Novel large signal mathematical model of mm–wave Gunn device", International conference on millimeter waves and far–infrared technology conference digest (Cat. No. 89TH0257–6), 1989, pp. 500–502.

Wang Dongjin et al., "VCO for millimeter–wave phase–locked sources", International conference on millimeter waves and far–infrared technology conference digest (Cat. No. 89TH0257–6), 1989, pp. 503–505.

Wang Dongjin, "A new viewpoint on the operation principles of the reflection type cavity–stabilized Gunn oscillator", International conference on millimeter waves and far–infrared technology conference digest (Cat. No. 89TH0257–6), 1989, pp. 506–509.

S. P. Kuo et al., "Operation of a sixteenth harmonic cusptron oscillator", International conference on millimeter waves and far–infrared technology conference digest (Cat. No. 89TH0257–6), 1989, pp. 510–513.

Igor Alexeff et al., "Recent developments in the Orbitron MASER", International conference on millimeter waves and far–infrared technology conference digest (Cat. No. 89TH0257–6), 1989, pp. 583–587.

V. K. Malyutenko et al., "Thermal–emitting diodes for IR", International conference on millimeter waves and far–infrared technology conference digest (Cat. No. 89TH0257–6), 1989, pp. 588–590.

Valentin M. Feru et al., "An absolute radiometric evaluation of the spectral irradiance created by the optical radiation sources", International conference on millimeter waves and far–infrared technology conference digest (Cat. No. 89TH0257–6), 1989, p. 591.

V. I. Gavrilenko et al., "Negative cyclotron mass MASER—A new type of semiconductor generator for millimeter and submillimeter wave range", International conference on millimeter waves and far–infrared technology conference digest (Cat. No. 89TH0257–6), 1989, pp. 592–596.

E. V. Beregulin et al., "Saturation absorption of the IR–FIR radiation in semiconductors and its technical utilization", International conference on millimeter waves and far–infrared technology conference digest (Cat. No. 89TH0257–6), 1989, pp. 597–600.

I. E. Aronov et al., "Radiowave excitation of resonant D. C. electromotive force in metals", International conference on millimeter waves and far–infrared technology conference digest (Cat. No. 89TH0257–6), 1989, p. 601.

M. V. Burtyka et al., "Instability of electromagnetic oscillations of the millimeter wave range specified by injection of charge carrier in inhomogeneous semiconductor structures", International conference on millimeter waves and far–infrared technology conference digest (Cat. No. 89TH0257–6), 1989, pp. 602–605.

Li Dunfu et al., "Stability condition for 8mm phase–locked source", International conference on millimeter waves and far–infrared technology conference digest (Cat. No. 89TH0257–6), 1989, pp. 606–609.

Wanjun Bi et al., "Experimental study of an overmode power combiner of 8mm IMPATT diodes", International conference on millimeter waves and far–infrared technology conference digest (Cat. No. 89TH0257–6), 1989, pp. 610–613.

Hua–fang Zhang et al., "Varactor–tuned Ka–band Gunn oscillator", International conference on millimeter waves and far–infrared technology conference digest (Cat. No. 89TH0257–6), 1989, pp. 614–616.

A. A. Lavrinovich, "7mm traveling–wave MASER with gain bandwidth exceeding 200 MHz", International conference on millimeter waves and far–infrared technology conference digest (Cat. No. 89TH0257–6), 1989, pp. 617–618.

\* cited by examiner

ELECTRON DENSITY MEASUREMENT AND CONTROL SYSTEM USING PLASMA-INDUCED CHANGES IN THE FREQUENCY OF A MICROWAVE OSCILLATOR

CROSS-REFERENCE TO RELATED APPLICATIONS

The present application is related to provisional applications Ser. No. 60/144,880 filed on Jul. 20, 1999 entitled "ELECTRON DENSITY MEASUREMENT AND PLASMA PROCESS CONTROL SYSTEM USING A MICROWAVE OSCILLATOR LOCKED TO AN OPEN RESONATOR CONTAINING THE PLASMA," and Ser. No. 60/144,833, filed on Jul. 21, 1999, "ELECTRON DENSITY MEASUREMENT AND PLASMA PROCESS CONTROL SYSTEM USING CHANGES IN TE RESONANT FREQUENCY OF AN OPEN RESONATOR CONTAINING THE PLASMA". Both of those applications are herein incorporated by reference in their entirety.

BACKGROUND OF THE INVENTION

1. Field of the invention

The present invention provides a method and system for measuring electron densities in a plasma processing system, such as is used in semiconductor processing systems.

2. Description of the Background

There are at least three known microwave-based techniques for determining plasma electron densities: (1) microwave interferometry, (2) measurement of reflection and absorption, and (3) perturbation of cavity resonant frequencies. Each of the concepts is described in simplified terms below.

Microwave interferometry involves the determination of the phase difference between two microwave beams. The first bears provides a reference signal, and the second beam passes through a reactive environment and undergoes a phase shift relative to the first beam. The index of refraction is calculated from the measured change in the phase difference between the two beams. This interferometric technique has been documented by Professor L. Goldstein of the University of Illinois at Urbana. Interferometry is described in the following U.S. Pat. Nos. 2,971,153; 3,265,967; 3,388, 327; 3,416,077; 3,439,266; 3,474,336; 3,490,037; 3,509, 452; and 3,956,695, each of which is incorporated herein by reference. Some plasma properties may be indirectly determined from measurements of the absorption of a microwave beam as it traverses a region in which a plasma is present. Signal reflections in plasmas are described in U.S. Pat. No. 3,599,089 and 3,383,509.

Plasma electron densities have also been measured using a technique which measures the perturbations of cavity resonant frequencies. The presence of a plasma within a resonator affects the frequency of each resonant mode because the plasma has an effective dielectric constant that depends on plasma electron density. This technique has been documented by Professor S. C. Brown of the Massachusetts Institute of Technology. Portions of this technique are described in U.S. Pat. No. 3,952,246 and in the following non-patent articles: Haverlag, M., et al., J Appl Phys 70 (7) 3472–80 (1991): Measurements of negative ion densities in 13.56 MHZ RF plasma of $CF_4$, $C_2F_6$, $CHF_3$, and $C_3F_8$ using microwave resonance and the photodetachment effect and Haverlag, M., et al., Materials Science Forum, vol. 140–142, 235–54 (1993): Negatively charged particles in fluorocarbon RF etch plasma: Density measurements using microwave resonance and the photodetachment effect.

SUMMARY OF THE INVENTION

It is an object of the present invention to provide a more accurate plasma measuring system than the prior art.

It is a further object of the present invention to provide an improved plasma measuring system using plasma induced changes in the frequency of a microwave oscillator.

These and other objects of the present invention are achieved through the use of a feedback loop that measures and controls a signal passing through a plasma chamber. Using a computer or digital signal processor (DSP), the present invention measures a frequency of a signal passing through the plasma and compares the measured frequency to a desired frequency. Based on a difference between the measured and desired frequencies, the computer/DSP controls the plasma generator to increase or decrease power to the plasma chamber, thereby affecting plasma electron density.

BRIEF DESCRIPTION OF THE DRAWINGS

A more complete appreciation of the invention and many of the attendant advantages thereof will become readily apparent with reference to the following detailed description, particularly when considered in conjunction with the accompanying draings, in which.

DETAILED DESCRIPTION OF THE PREFERRED EMBODIMENTS

Figure 1A:
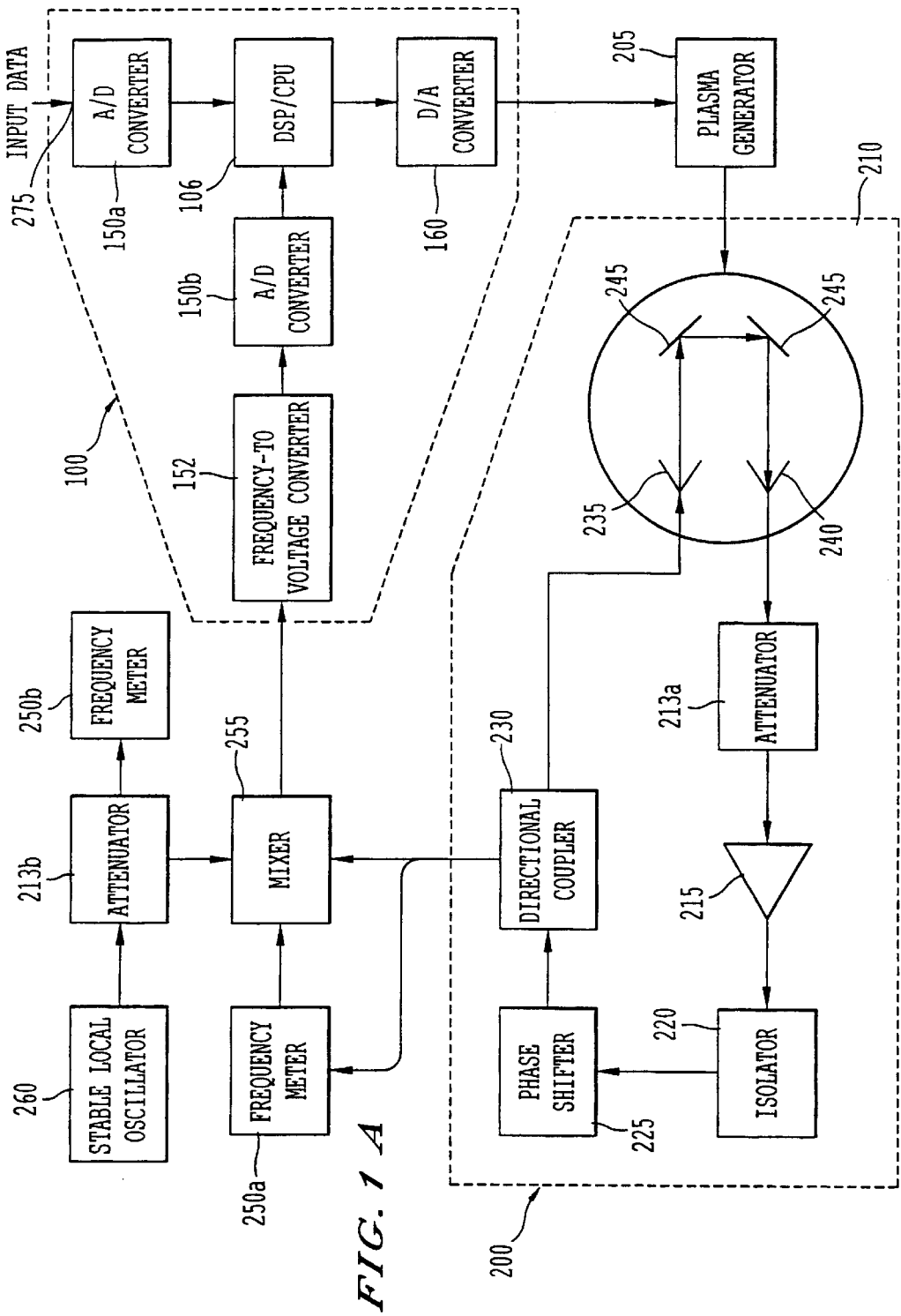
FIG. 1A is a block diagram of a plasma electron density measurement system according to the present invention.

Referring now to the drawings, in which like reference numerals designate identical or corresponding parts throughout the several views, FIG. 1A is a block diagram of a plasma electron density measurement system according to the present invention for measuring a plasma generated in a plasma chamber 200. One embodiment of the present invention uses a plasma generator 205 and a self-excited microwave oscillator 210 that comprises, in a closed loop, an oscillation circuit 201a (including an attenuator 213a, a narrow-band microwave amplifier 215, an isolator 220, a phase shifter 225, and a directional coupler 230) and the plasma chamber 200 including an open radiation path that further includes at least one transmitter antenna 235, at least one receiver antenna 240, and may include one or more reflectors. 245. The transmitter antennas 235 and receiver antennas 240 may be horns, dielectric lenses, or other forms of radiators; and the reflectors 245 may have planar or curved surfaces or may be diffraction gratings.

Figure 1B:
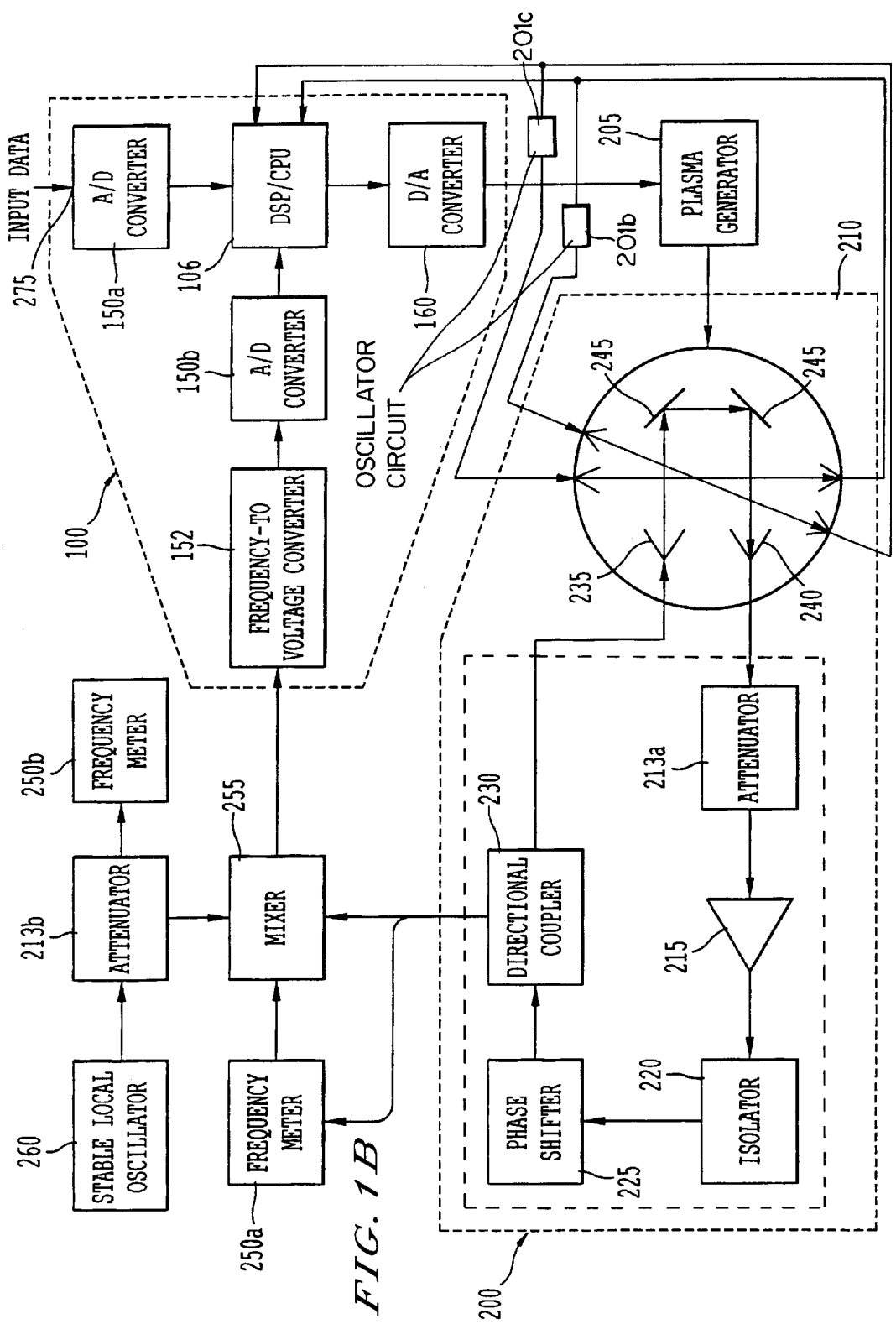
FIG. 1B is a block diagram of a plasma electron density measurement system according to the present invention using multiple receivers.

As shown in the embodiment in FIG. 1A, the transmitter 235, the reflectors 245, and the receiver 240 may be oriented in such a way that the open radiation path lies essentially in a plane that is parallel to the surface of a wafer being processed in the plasma chamber 200. However, alternate embodiments include other configurations for which the plane of the open radiation path is not parallel to the surface of a wafer being processed, or for which the open radiation path does not even lie in a plane. Moreover, alternate embodiments also include using plural microwave beam paths, either of the same length or of different lengths, in a variety of configurations (see, for example, FIG. 1B utilizing plural receivers 235 and their corresponding oscillator circuits 201b and 201c). Examples of configurations include, but are not limited to, star- and triangular-shapes. Likewise, when using multiple systems whose microwave beams intersect at several locations within the interior of the plasma, it may be possible to extract spatial information (similar to tomography) rather than the plasma electron density integrated along a beam length.

If the gain of the amplifier is sufficiently high, self excited oscillators at distinct frequencies will occur. These frequencies satisfy two criteria:

1. The net round-trip gain, which is a product of the numerical power gain of the amplifier, G, the transmission coefficients of all junctions, and the reflection coefficients of all mirrors, must exceed 1.

$$G \cdot \left\{ \sum_{i=1}^{n} T_i \cdot \sum_{j=1}^{m} R_j \right\} \geq 1 \quad (1)$$

where it is assumed that there are "n" junctions whose transmission coefficients are less than 1 and the path includes "m" reflectors whose reflection coefficients are less than 1. While this is a necessary condition for oscillation, it is not sufficient; sufficiency is provided by the second criterion.

2. The round-trip shift of the electromagnetic waves in the loop due to all causes must add to an integer multiple of $2\pi$ radians. This insures the build-up of coherent oscillation from noise. The phase shifts associated with the majority of the passive junctions and mirrors in the loop are virtually independent of frequency and thus do not play an important role in the measurement method described herein, as described below. The phase shifts of the electromagnetic waves traversing the round-thp are predominantly due to three sources: the propagation in the region in which the plasma is formed; the propagation in the waveguides and components in the waveguides; and the propagation (and amplification) by the amplifier. Thus the sufficiency condition can be written as:

$$\left[ \sum_{i=1}^{n} \phi_i + \sum_{j=1}^{m} \phi_j \right] + \phi_{amp}(\omega') + \beta(\omega')d_{ckt} + \frac{\omega'}{c} \int_0^{d_p} n_p(\omega', z) dz = q \cdot 2\pi \quad (2)$$

where the first bracket represents the phase shifts from any junctions (i) or mirrors (m); $\phi_{amp}(\omega')$ is the phase shift of the amplifier; $\beta(\omega')d_{ckt}$ is the phase shift of the wave propagating through the connecting waveguides, attenuators, phase shifters and other passive components comprising the circuit; and the last term on the left-hand-side of the equation is the phase shift of the wave traversing the region containing the plasma. The term $n_p(\omega',Z)$ is the index of refraction of the plasma, $\omega'$ is the radian frequency of the wave in the presence of a plasma filling the arm from Z=0 to Z=$d_p$, and the electromagnetic length is assumed to be $d_p$ inside the processing chamber and $d_{ckt}$ for the rest of the connecting circuit. It is also assumed that the unguided waves in the plasma region can be approximated by uniform plane waves with a phase constant given by $\omega'n/c$.

Figure 3:
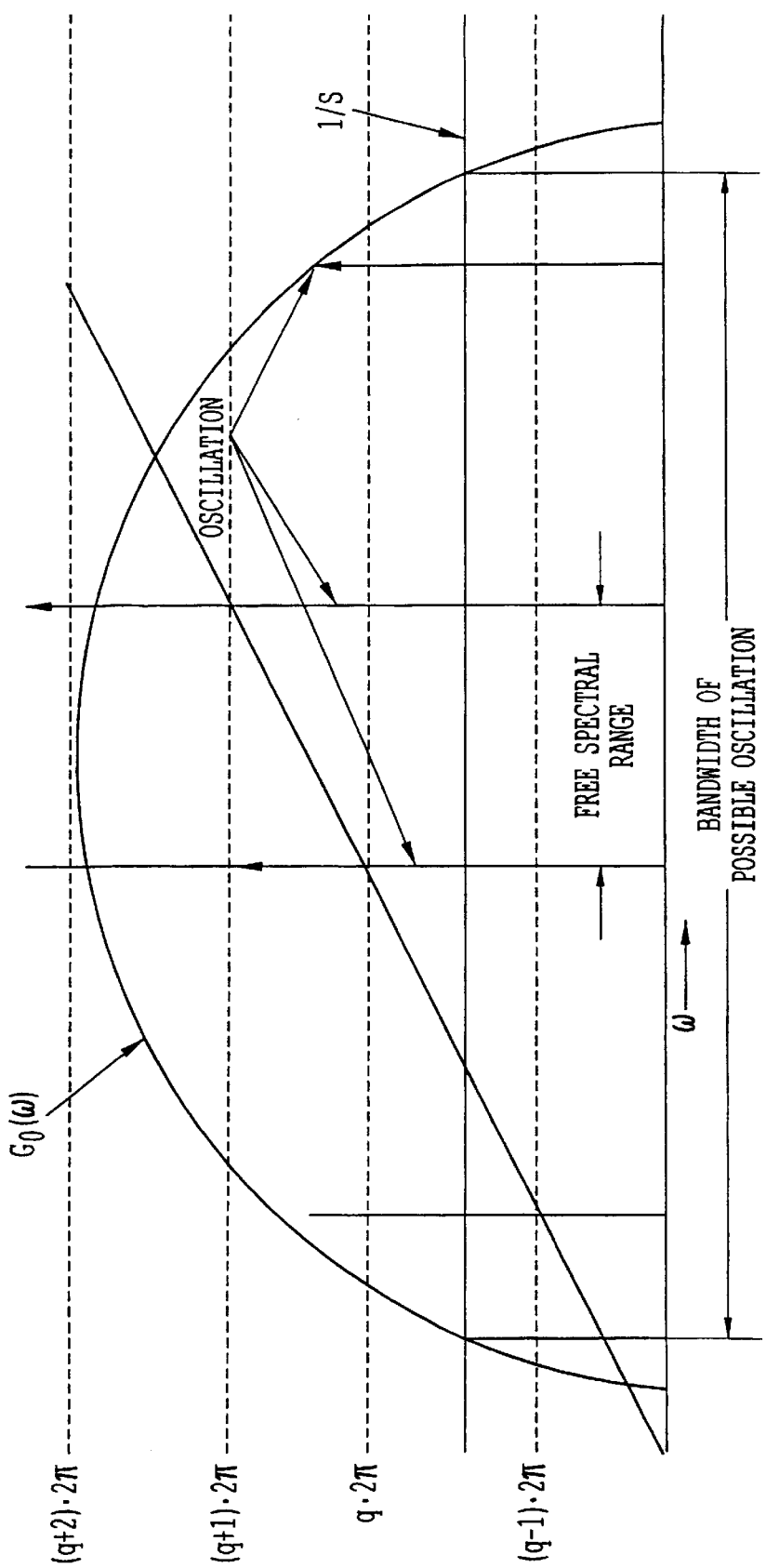
FIG. 3 is a graph showing system response vresus frequency.

A graphical display of the consequences of (1) and (2) (plotted as a function of $\omega$) is shown in FIG. 3 in which $G_0(\omega)$ is the small signal gain of the amplifier and S is the fraction of the electromagnetic power that survives a round-trip and is an abbreviation for the brace in (1); and the bracket and phase shift of the amplifier in (2) is ignored for graphical clarity; and $\beta(\omega)$ is approximated by $\omega/c$, the phase constant for a uniform plane wave. The left-hand side of (2) becomes a straight line with a slope vs. radian frequency of $[d_{ckt}+n_p d_p]/c$ if the frequency dependence of the plasma refractive index is ignored for the purpose of the figure. It is noted that the requirement of (1) merely restricts oscillation to be a fraction of the amplifier bandwidth in which $G_0 \geq 1$, and that fraction can be decreased by adding attenuation in the feedback loop, decreasing the value of S and increasing the value of 1/S.

The intersection of the straight line representing (2) with the dashed horizontal lines separated vertically by $2\pi$ are the radian frequencies that satisfy (2) and if they also satisfy (1) become the frequencies of oscillation. Those that do so are shown as a solid arrow pointing up. Each amplitude is proportional to the excess gain (i.e., $G_0(\omega)S-1$) at the frequency. If the free spectral range (i.e., the separation between adjacent solutions to (2)), is small compared to the bandwidth of possible oscillation, then oscillation at multiple frequencies is possible and/or probable.

Returning to the description of FIG. 1A, FIG. 1A also shows a frequency meter 250a connected between the output of the directional coupler 230 and one input of a mixer 255. A frequency stable local oscillator 260 is connected through an attenuator 213b to the second input of the mixer 255. The frequency of the frequency stable local oscillator 260 is chosen to be either slightly below or slightly above the pass-band of the narrow-band amplifier 215. (The attenuator 213b is also connected to a second frequency meter 250b which verifies the frequency of the stable local oscillator 260.) To simplify subsequent discussions, it is assumed that the frequency of the frequency stable local oscillator 260 is set slightly below the pass-band of the narrow-band amplifier 215. The frequency of the IF signal that emerges from the mixer 255 is the difference between the frequency of the frequency stable local oscillator 260 and the frequency of the self-excited oscillator 210. The frequency of the IF signal is typically in the range from 0 to approximately 2 GHz, according to the described embodiment. Other frequency ranges are, of course, possible for other amplifier parameters.

Figure 2:
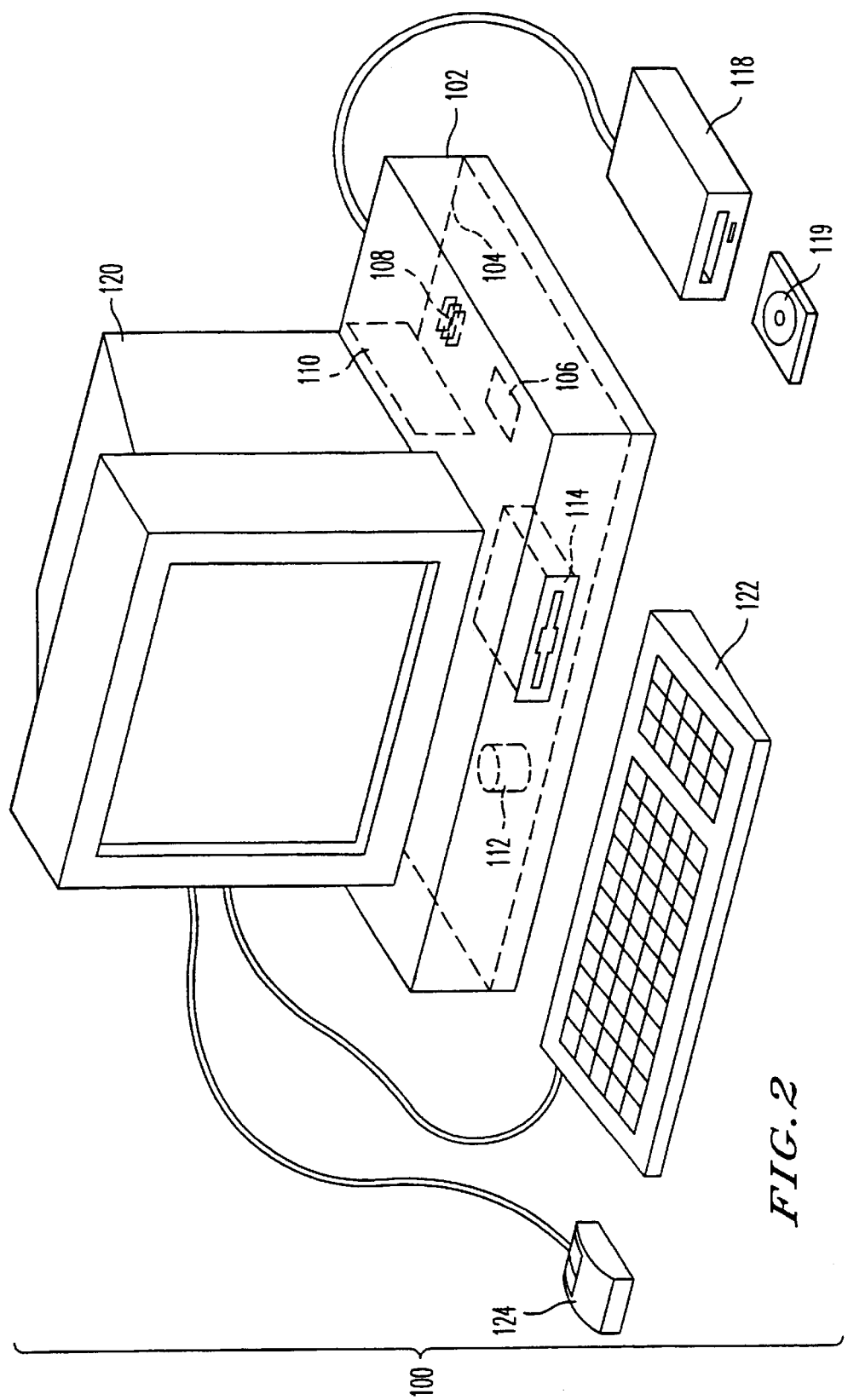
FIG. 2 is a schematic illustration of a computer system for implementing a portion of the measurement system of FIG. 1A.

FIG. 2 is a schematic illustration of a computer system 100 for measuring and controlling the plasma generated in the plasma chamber 200 by the plasma generator 205. A computer 100 implements the method of the present invention, wherein the computer housing 102 houses a motherboard 104 which contains a CPU 106, memory 108 (e.g., DRAM, ROM, EPROM, EEPROM, SRAM and Flash RAM), and other optional special purpose logic devices (e.g., ASICs) or configurable logic devices (e.g., GAL and reprogrammable FPGA). The computer 100 also includes plural input devices, (e.g., a keyboard 122 and mouse 124), and a display card 110 for controlling monitor 120. In addition, the computer system 100 further includes a floppy disk drive 114; other removable media devices (e.g., compact disc 119, tape, and removable magneto-optical media (not shown)); and a hard disk 112, or other fixed, high density media drives, connected using an appropriate device bus (e.g., a SCSI bus, an Enhanced IDE bus, or an Ultra DMA bus). Also connected to the same device bus or another device bus, the computer 100 may additionally include a compact disc reader 118, a compact disc reader/writer unit (not shown) or a compact disc jukebox (not shown). Although compact disc 119 is shown in a CD caddy, the compact disc 119 can be inserted directly into CD-ROM drives which do not require caddies. In addition, a printer (not shown) also provides printed listings of plasma electron densities for different times and conditions.

As stated above, the system includes at least one computer readable medium. Examples of computer readable media are compact discs 119, hard disks 112, floppy disks, tape, magneto-optical disks, PROMs (EPROM, EEPROM, Flash EPROM), DRAM, SRAM, etc. Stored on any one or on a combination of computer readable media, the present invention includes software for controlling both the hardware of the computer 100 and for enabling the computer 100 to interact with a human user. Such software may include, but is not limited to, device drivers, operating systems and user applications, such as development tools. Such computer readable media further include the computer program product of the present invention for monitoring and controlling a plasma in a plasma chamber. The computer code devices of the present invention can be any interpreted or executable code mechanism, including but not limited to scripts, interpreters, dynamic link libraries, Java classes, and complete executable programs.

As shown in FIG. 1A, the IF signal frequency is received by a frequency-to-voltage convertor 152 in the computer 100 and converted into a digital signal by analog-to-digital (A/D) convertor 150b. (In an alternate embodiment, the frequency-to-voltage convertor 152 and the A/D convertor 150b are replaced by a digital counter which counts the number of IF cycles.) The computer 100 also received input data 275 provided by the equipment operator which is converted by a second A/D convertor 150a. In an alternate embodiment, the input data 275 is received directly in digital form (e.g., through the keyboard 122), and in that embodiment the second AID convertor 150A is not necessary. The DSP or CPU 106 receives and compares the digital IF signal to the input data 275 and transmits a digital output signal to a digital-to-analog (D/A) converter 160 which, in turn, transmits an analog signal to the plasma generator 205 to modify, if necessary, the output power of the plasma generator 205. In an alternate embodiment, the D/A convertor 160 is incorporated in a modified plasma generator 205', and the digital output from the DSP/CPU 106 is applied directly to the modified plasma generator 205'.

The frequency of the self-excited oscillator shown in FIG. 1A is dependent upon the electron density of the plasma along the path of the circuit within the processing chamber, and thus the shift in its operating frequency can be used to control the plasma generator. The relationship between the shift in frequency and the spatially averaged electron density of the plasma is derived below.

If the plasma electron density is zero, $n_p(\omega, Z)=1$, so then equation (2) becomes:

$$\left[\sum_{i=1}^{n}\phi_i + \sum_{j=1}^{m}\phi_j\right] + \phi_{amp}(\omega) + \beta(\omega)d_{ckt} + \frac{\omega}{c}\int_0^{d_p} 1 dz = q \cdot 2\pi \quad (3)$$

where it is recognized that the index of refraction in the processing chamber reverts back to its vacuum value (n=1) along the path from z=0 to Z=$d_p$. As a consequence, the frequency reverts to $\omega$ rather than $\omega'$, where $\omega'=\omega+\Delta\omega=\omega+0$ because there is no frequency shift. The same quantity appears on the right hand side of equations (2) and (3), thus the left-hand sides of (2) and (3) can be equated. Thus the first bracket in equations (2) and (3) cancel, and the remaining terms can be grouped as follows:

$$\frac{\omega d_p}{c} \cdot \frac{1}{d_p}\int_0^{d_p}[1-n_p(\omega,z)]dz = \quad (4)$$

$$[\phi_{amp}(\omega') - \phi_{amp}(\omega)] + [\beta(\omega')d_{ckt} - \beta(\omega)d_{ckt}]$$

where the distinction between $\omega'$ and $\omega$ is ignored for the terms multiplying the integral and in the expression for the plasma refractive index.

$$n_p(\omega) \approx \sqrt{1 - \frac{\omega_p^2}{\omega^2}} \approx 1 - \frac{1}{2}\cdot\frac{\omega_p^2}{\omega^2} \quad \text{for} \quad \frac{\omega_p^2}{\omega^2} \ll 1 \quad \text{and} \quad (5)$$

$$\omega_p^2 = \frac{N_e e^2}{m\varepsilon_0} = \text{plasma frequency,} \quad (6)$$

with $N_e$=electron density (in $m^{-3}$).

A Taylor series expansion is used to evaluate the quantities $\phi_{amp}$ and $\beta$ at $\omega'$ in terms of the values at $\omega$ and the shift in frequency $\Delta\omega$.

$$\phi_{amp}(\omega') = \phi_{amp}(\omega) + \frac{\partial\phi_{amp}(\omega)}{\partial\omega}\cdot\Delta\omega \quad (7a)$$

$$\beta(\omega') = \beta(\omega) + \frac{\partial\beta(\omega)}{\partial\omega}\cdot\Delta\omega \quad (7b)$$

The term involving the partial derivative of $\phi_{amp}$ is the group delay $T_g$ inserted by the amplifier and is usually quite small; the term involving the partial derivative of $\beta$ is the inverse of the group velocity $v_g$ (where $v_g$ is less than c). Thus equation (4) can be approximated by:

$$\frac{e^2}{m\varepsilon_0}\cdot\left[\frac{1}{d_p}\int_0^{d_p}N_e(z)dz\right] = \frac{\langle N_e\rangle e^2}{m\varepsilon_0} = 2\cdot\Delta\omega\cdot\omega\cdot\left\{\frac{c}{v_g}\cdot\frac{d_{ckt}}{d_p} + \frac{cT_g}{d_p}\right\} \quad (8)$$

Equation (8) states the spatially averaged electron density is related to the frequency shift $\Delta\omega$, the nominal frequency of oscillation $\omega$, the fundamental constants c, m, and $\epsilon_0$, and the quantities in the brace of (8) which need to be determined only once.

The frequency of oscillation $\omega$ can be measured with a common wavemeter to better than 1% accuracy; the fundamental constants are known very precisely; and the brace can be determined experimentally by filling the path $d_p$ with a heavy gas such as $SF_6$, Argon, or Xenon at various pressures and evaluating the frequency shift $\Delta\omega$. (For such a calibration procedure, the local oscillator (LO) should be higher in frequency than the controlled oscillator.) The latter can be measured to great accuracy using the heterodyne technique in which the frequency $\omega'$ is mixed with a stable local oscillator at $\omega_{LO}$ and so that the difference $\omega'-\omega_{LO}$ can be measured with a frequency counter or other well known frequency determining techniques.

The average electron density of equation (8) is then used as a feedback control for controlling the voltage applied to the plasma generator 205 connected to the plasma chamber 200.

According to the present invention, one example of a method for obtaining an approximate value for the average electron density between the transmitter 235 and the receiver 245 comprises the following steps:

1. Turn on the measurement apparatus and allow it to come to a stable condition after plasma initiation.
2. Enter the value of the term in the braces of equation (8). Note that this value depends on the settings of the adjustable elements in the feedback loop (e.g., the attenuator 213a and the phase shifter 225); so the settings should not be changed after the determination has been made. In an alternate embodiment, plural values are constructed for the term in braces in equation (8) (with one for each possible combination of environmental settings), and the proper value is chosen during operation based on the environmental settings.

3. Verify the frequency of the frequency stable local oscillator 260 and adjust if necessary.
4. Enter the desired plasma electron density at the keyboard 122 or at another data entry port.
5. Initiate the process from the data entry port.

Based on the difference between the desired IF signal and the measured IF signal, the output of the plasma generator 205 is adjusted to make the desired and measured IF signals more closely matching. For example, if the measured IF signal is greater than the desired IF signal, the output RF power is reduced by one increment. Likewise, if the measured IF signal is less than the desired IF signal, the output RF power is increased by one increment. Moreover, for coarse adjustments, a predetermined relationship between the plasma electron density and the RF power can be used to approximate an RF power to be applied. Then, finer tuning is applied to more accurately control the plasma system.

In one embodiment of a fine tuning method, the RF power applied is adjusted (i.e., increased or decreased by a given increment) until the difference between the measured and desired signals cannot be more closely matched based on the size of the given increment. The given increment is then decreased (e.g., by half), and the fine tuning is continued until the new given increment is also too coarse. However, if the difference between the measured and desired signals becomes greater than that which can be matched by the current interval, the current interval is increased.

In yet another embodiment of the tuning method, additional information is used to fine tune the feedback/control process. Such information may include, but is not limited to, the change of the signal per change in RF power (i.e., the first derivative), the second derivative, and the integral. The present invention is a general control mechanism and is not limited by the type of information or the feedback mechanism chosen.

The accuracy of the present method as compared with the prior art is described hereinafter. It is assumed that the feedback loop can be divided into two parts of equal physical length L. The first part represents the open radiation path, and the second part represents the rest of the feedback loop. In the absence of a plasma the frequency is f, and the wavelength in the open radiation path is $\lambda_2$. The wavelength in the rest of the feedback loop is $\lambda_1$, and the length of the feedback loop in wavelengths is q. For simplicity, it is assumed also that the phase velocity of the signal in the entire feedback loop is c. (Clearly the phase velocity in the waveguide is greater than c, but that complicating factor is neglected here.) From these assumptions, it follows that $$L/\lambda_1 + L/\lambda_2 \approx Lf_1/c + Lf_1/c \approx q. \tag{9}$$

In the presence of a plasma, the frequency becomes $f_2$, the mean index of refraction in the open radiation path becomes <n> and the total length of the feedback path in wavelengths remains q. Consequently, $$Lf_2/c + <n> Lf_2/c \approx q. \tag{10}$$

Equations (9) and (10) are combined to yield:

$$\frac{1-\langle n \rangle}{1+\langle n \rangle} \approx \frac{f_2 - f_1}{f_1}. \tag{11}$$

The frequency difference $f_2-f_1$ corresponds to the IF frequency described above. By evaluating the differentials of the natural logarithm, equation (15) is obtained as follows:

$$\delta\ln\left(\frac{1-\langle n \rangle}{1+\langle n \rangle}\right) = \delta\ln\left(\frac{f_2-f_1}{f_1}\right) \tag{12}$$

$$\frac{\delta\left(\frac{1-\langle n \rangle}{1+\langle n \rangle}\right)}{\left(\frac{1-\langle n \rangle}{1+\langle n \rangle}\right)} \approx \frac{\delta\left(\frac{f_2-f_1}{f_1}\right)}{\left(\frac{f_2-f_1}{f_1}\right)} \approx \frac{\delta\left(\frac{IF}{f_1}\right)}{\left(\frac{IF}{f_1}\right)}. \tag{13}$$

Here $IF = f_2 - f_1$ is the IF signal frequency. For a fixed $f_1$ and with the approximation that $$1 + <n> \approx 2 \tag{14}$$

which is quite good for the situations of interest here, one can show that:

$$\left|\frac{\delta(1-\langle n \rangle)}{1-\langle n \rangle}\right| \le \left|\frac{\delta IF}{IF}\right| + \left|\frac{\delta f_1}{f_1}\right| \tag{15}$$

Reasonable expectations for measurement accuracies lead to estimations of about 0.0025 for each of the terms on the right side of equation (15) above. Consequently, $$\left|\frac{\delta(1-\langle n \rangle)}{1-\langle n \rangle}\right| \approx 0.005. \tag{16}$$

Given that:

$$n \approx 1 - \frac{e^2}{8\pi^2 \varepsilon_0 m f^2} N, \tag{17}$$

it follows that:

$$\frac{\delta(1-\langle n \rangle)}{1-\langle n \rangle} \approx 0.005 \approx \frac{\delta \langle N \rangle}{\langle N \rangle} \tag{18}$$

and the expected accuracy is on the order of 0.5%

Obviously, numerous modifications and variations of the present invention are possible in light of the above teachings. It is therefore to be understood that, within the scope of the appended claims, the invention may be practiced otherwise than as specifically described herein.

What is claimed is:

1. A system for measuring at least one of a plasma density and an electron density in at least one of a plasma source, a plasma chamber and an electron source of a semiconductor processing system, the system comprising:
   a transmitter for transmitting a first electromagnetic signal through the at least one of the plasma source, the plasma chamber, and the electron source;
   a first receiver for measuring the first electromagnetic signal passed through the at least one of the plasma source, the plasma chamber, and the electron source; and
   a controller for determining the at least one of the plasma density and the electron density of the at least one of the plasma source, the plasma chamber, and the electron source of the semiconductor processing system from the first electromagnetic signal measured by the first receiver.

2. The system as claimed in claim 1, wherein at least one of the plasma density and the electron density of the at least one of the plasma source, the plasma chamber and the electron source is in a range from $10^{10}$ to $10^{12}$ cm$^{-3}$.

3. The system as claimed in claim 1, further comprising a self-excited microwave oscillator coupled to the first receiver.

4. The system as claimed in claim 3, further comprising:
a stable local oscillator; and
a mixer, wherein a first frequency of the self-excited oscillator and a second frequency of the stable local oscillator are mixed to produce an IF signal.

5. The system as claimed in claim 1, wherein the first receiver is coupled to a closed loop including an open radiation path for transmitting the first electromagnetic signal.

6. The system as claimed in claim 5, wherein the open radiation path comprises a plasma.

7. The system as claimed in claim 5, wherein the closed loop further comprises a narrow band microwave amplifier in the open radiation path.

8. The system as claimed in claim 5, wherein the open radiation path further comprises at least one reflector.

9. The system as claimed in claim 1, wherein the controller comprises a digital signal processor.

10. The system as claimed in claim 1, wherein the controller comprises a central processing unit.

11. The system as claimed in claim 1, further comprising a plasma generator, wherein the controller further comprises an input for receiving a reference signal representing at least one of a desired plasma density and a desired electron density, wherein the controller comprises the electromagnetic signal and the reference signal to determine a deviation from the at least one of a desired plasma density and a desired electron density and controls an output power of the plasma generator.

12. The system as claimed in claim 11, further comprising a second sensor, wherein the reference signal is received at the second receiver in analog form.

13. The system as claimed in claim 11, further comprising a second receiver, wherein the reference signal is received at the second receiver in digital form.

14. The system as claimed in claim 13, further comprising a data entry device for entering the reference signal.

15. The system as claimed in claim 14, wherein the data entry device comprises a keyboard.

16. A system for measuring at least one of a plasma density and an electron density in at least one of a plasma source, a plasma chamber and an electron source, the system comprising:
a transmitter for transmitting a first electromagnetic signal through the at least one of the plasma source, the plasma chamber, and the electron source;
a first receiver for measuring the first electromagnetic signal passed through the at least one of the plasma source, the plasma chamber, and the electron source;
a controller for determining the at least one of the plasma density and the electron density of the at least one of the plasma source, the plasma chamber, and the electron source from the first electromagnetic signal measured by the first receiver; and
a second receiver for measuring a second electromagnetic signal passed through the at least one of the plasma source, the plasma chamber and the electron source.

17. The system as claimed in claim 16, wherein the first and second electromagnetic signals are passed through different lengths.

18. A system for measuring at least one of a plasma density and an electron density in at least one of a plasma source, a plasma chamber and an electron source, the system comprising:
a transmitter for transmitting a first electromagnetic signal through the at least one of the plasma source, the plasma chamber, and the electron source;
a first receiver for measuring the first electromagnetic signal passed through the at least one of the plasma source, the plasma chamber, and the electron source;
a controller for determining the at least one of the plasma density and the electron density of the at least one of the plasma source, the plasma chamber, and the electron source from the first electromagnetic signal measured by the first receiver; and
second and third receivers for measuring second and third electromagnetic signals passed through the at least one of the plasma source, the plasma chamber, and the electron source, wherein paths of the second and third electromagnetic signals intersect a path of the first electromagnetic signal.

19. A method of measuring at least one of a plasma density and an electron density of at least one of a plasma source, a plasma chamber, and an electron source of a semiconductor processing system, the method comprising the steps of:
transmitting a first electromagnetic signal through the at least one of the plasma source, the plasma chamber, and the electron source;
measuring the first electromagnetic signal passed through the at least one of the plasma source, the plasma chamber, and the electron source; and
determining the at least one of the plasma density and the electron density of the at least one of the plasma source, the plasma chamber and the electron source of the semiconductor processing system from the first measured electromagnetic signal.

20. The method as claimed in claim 19, wherein the step of measuring the first electromagnetic signal comprises measuring, the at least one of the plasma density and the electron density of the at least one of the plasma source, the plasma chamber, and the electron source having a density in a range from $10^{10}$ to $10^{12}$ electrons/cm$^3$.

21. The method as claimed in claim 19, further comprising the step of applying a control signal from a self-excited microwave oscillator to the at least one of the plasma source, the plasma chamber, and the electron source to maintain the at least one of the plasma source, the plasma chamber, and the electron source.

22. The method as claimed in claim 21, further comprising the step of:
mixing a first frequency of the self-excited oscillator and a second frequency of a stable local oscillator to produce an IF signal.

23. The method as claimed in claim 19, wherein the step of measuring the first electromagnetic signal comprises measuring the first electromagnetic signal using a closed loop including an open radiation path for transmitting the first electromagnetic signal.

24. The method as claimed in claim 23, wherein the step of measuring the first electromagnetic signal comprises measuring the first electromagnetic signal using a closed loop including a narrow band microwave amplifier in the open radiation path.

25. The method as claimed in claim 23, further comprising the step of providing a plasma as the open radiation path.

26. The method as claimed in claim 19, further comprising the steps of:

entering at least one of a desired plasma density and a desired electron density by an equipment operator as a reference signal; and comparing the at least one of the plasma density and the electron density of the at least one of the plasma source, the plasma chamber, and the electron source with the at least one of a desired plasma density and a desired electron density.

27. The method as claimed in claim 26, further comprising the step of applying a control signal to the at least one of the plasma source, the plasma chamber, and the electron source to modify the at least one of the plasma density and the electron density of the at least one of the plasma source, the plasma chamber, and the electron source based on a result of the comparing step.

28. The method as claimed in claim 19, further comprising the step of entering on a keyboard at least one of a desired plasma density and a desired electron density as a reference signal.

29. The method as claimed in claim 19, wherein the step of determining comprises determining using a digital signal processor.

30. The method as claimed in claim 19, wherein the step of transmitting the first electromagnetic signal comprises reflecting the first electromagnetic signal off at least one reflector.

31. A method of measuring at least one of a plasma density and an electron density of at least one of a plasma source, a plasma chamber, and an electron source, the method comprising the steps of:

transmitting first and second electromagnetic signals through the at least one of the plasma source, the plasma chamber, and the electron source;

measuring the first electromagnetic signal passed through the at least one of the plasma source, the plasma chamber, and the electron source;

measuring a second electromagnetic signal passed through the at least one of the plasma source, the plasma chamber, and the electron source; and determining the at least one of the plasma density and the electron density of the at least one of the plasma source, the plasma chamber and the electron source from the measured first and second electromagnetic signals.

32. The method as claimed in claim 31, wherein the first and second electromagnetic signals are passed through different lengths.

33. The method as claimed in claim 31, wherein paths of the first and second electromagnetic signals intersect.

34. The method as claimed in claim 33, wherein the step of determining comprises determining at least one of a spatially resolved plasma density and a spatially resolved electron density.

* * * * *